(12) United States Patent  (10) Patent No.: US 7,911,029 B2
Cui  (45) Date of Patent: Mar. 22, 2011

(54) MULTILAYER ELECTRONIC DEVICES FOR IMBEDDED CAPACITOR

(76) Inventor: Ji Cui, Aurora, IL (US)

( * ) Notice: Subject to any disclaimer, the term of this patent is extended or adjusted under 35 U.S.C. 154(b) by 135 days.

(21) Appl. No.: 12/501,411

(22) Filed: Jul. 11, 2009

(65) Prior Publication Data

US 2011/0006393 A1     Jan. 13, 2011

(51) Int. Cl.
 *H01L 29/00* (2006.01)
(52) U.S. Cl. .................. 257/532; 257/E51.003
(58) Field of Classification Search .................. 257/532, 257/E51.003
See application file for complete search history.

(56) References Cited

U.S. PATENT DOCUMENTS

| | | | |
|---|---|---|---|
| 7,244,999 B2 * | 7/2007 | Aihara | 257/528 |
| 7,791,897 B2 * | 9/2010 | Das et al. | 361/766 |
| 2005/0019592 A1 * | 1/2005 | Bai et al. | 428/461 |
| 2006/0286696 A1 * | 12/2006 | Peiffer et al. | 438/27 |

* cited by examiner

*Primary Examiner* — Trung Dang

(57) ABSTRACT

Disclosed herein are multilayer electronic devices comprising a high dielectric constant polymer composite layer that contains conductive components for embedded capacitor applications.

20 Claims, 3 Drawing Sheets

MULTILAYER ELECTRONIC DEVICES FOR IMBEDDED CAPACITOR

BACKGROUND

1. Field of Invention

The present invention relates to polymer-based multilayer embedded capacitor devices comprising high dielectric constant polymer-composite thin film material that contains conductive components, and method for producing such multilayer embedded capacitors.

2. Description of Related Art

In electronics, integrating passive components into IC (integrated circuit) packages has the advantages of better electrical performances, higher reliability, smaller sizes, and more design options. Because of the large number of capacitors needed in modern electrical systems, embedded capacitors are of high importance. High dielectric constant polymer thin film is a solution for such embedded capacitors.

Common polymer composite materials for such applications are based on polymer binder combined with high dielectric constant ceramic powder: $BaTiO_3$. The polymer binder materials are usually epoxy or polyimide, which has dielectric constants of 3-6. The polymer composite materials are processed into thin layer of film that is sandwiched between two conductive copper layers. Because of the practical limit of adding high percentage of ceramic powder into the composite material system, the overall polymer composites generally have dielectric constants between 10 to 30, depending on the volume fractions of the ceramic components. U.S. Pat. No. 6,159,611 demonstrated a composite material having a high dielectric constant of 164. That composite material had an extremely high loading of 92% $BaTiO_3$ by weight. With that high loading of inorganic particles, the composite material have low bond strength to copper substrate and are practically difficult to use.

It is much more effective to increase dielectric constant of composite material by using conductive particles than using nonconductive ceramic powders such as $BaTiO_3$. U.S. Pat. No. 6,864,306 used conductive fillers to increase dielectric constant of polymer composite material. U.S. Pat. No. 6,762,237 used conductive carbon nanotube to increase the dielectric constants of polymer composite materials. Percolation theories suggest that the dielectric constant introduce by conductive components is the greatest when the conductive particles concentrations are close to the percolation threshold. The dielectric constants of this type of composite material using conductive additives are reported to be reaching 100 or even 1000.

In addition to the two types of fillers mentioned above: 1) traditional ceramic fillers, such as Barium Titanate, 2) conductive fillers, such as carbon black, carbon nano-tube, and metal particles, there are two new types of material that were recently used to increase dielectric constant of the polymer composite for embedded polymer thin film capacitors: 1) ceramic particles that have conductive domains. 2) coated conductive particles. Ceramic particles with conductive domain was disclosed in U.S. patent application U.S. Pat. No. 12,463,571, coated conductive particles were disclosed in U.S. Pat. No. 6,924,971 and U.S. Pat. No. 7,220,481.

The capacitance of a film is inversely proportional to the thickness of the dielectric film. Therefore, it is desirable to make the embedded capacitor to be thin for achieving high capacitance. Thicknesses of about 8-30 micron has been used in commercial products. The thin thickness creates significant challenges in manufacturing. In Printed Circuit Board (PCB) manufacture processes, large panels of 20 inch or wider are commonly used. It is required that the whole panel to be free of electrical shorting. Even extremely low level of conductive particles or dust can cause shorting across the thickness of the composite film.

The introduction of conductive particles in the thin composite film further increases the risk of shorting. If conductive fillers and or conductive filler aggregates, and/or agglomerate of conductive fillers create connected conductive path across the thickness of the panel, it will cause short-circuit and make the whole panel useless. For highest dielectric constant properties, it is recommended by percolation theory that the conductive particles concentration approaching percolation threshold. At such concentrations, the shorting risks are high. This makes it practically difficult to use. In general, the shorting risks are high when the loading of the conductive components is high, when the size of the filler is big, or when the film thickness is thin, or when the dispersion of conductive particles is poor, or when the conductive particles aggregate. For examples, one single 20 micron diameter aggregate or one 20 micron diameter particle of conductive filler will short the whole 20 inch by 20 inch panel.

Definitions Section

This section defines several important terms used throughout this invention. Please note that in the case of conflict with cited references the definition provided in this section should prevail.

Polymer composite: a blend of polymeric binder with inorganic or organic fillers. The volume percentage of the polymer is generally higher than 15%, preferred to be higher than 30%, more preferred to be higher than 50% for good bonding to substrates. If the organic filler, such as organic conducting polymer, is dispersed at molecular level in the binder, the mixture is still considered polymer composite under this definition.

Insulation layer: a layer of material that is essentially non-conductive. It can be organic material or inorganic material. To increase the dielectric constant of the material, high dielectric constant ceramic components and/or low loading of conductive components can be included in the layer to increase the dielectric constant of the material. There could be low occurrence of conductive channels, caused by impurities, conductive particles, coating defects, and others in insulation layer. As long as the probability of the location of the conductive channel in the insulation layer meeting the conductive channel of the adjacent layer is insignificant, this layer can effectively provide insulation property to the multilayer structure.

Conductive particles: particles that are essentially conductive, having an electrical conductivity, in its neat form, of higher than 1 S/cm, preferred to be above 1000 S/cm, and most preferred to be above 10000 S/cm, all measured at room temperature.

Conductive component: a component in a composite material that has conductive domain.

Effective dielectric constant: for multi-layer dielectric film, the effective dielectric constant is determined by the overall capacitance of the multilayer structure and the overall thickness of the multilayer dielectric structure.

Coated conductive particles: conductive particles whose surface is coated with an insulation material to prevent the particles from forming a continuous conductive path. The coating can be: 1) a coating covers the whole particle surface; 2) a coating partially covers the particle surface. The partial coverage need to be significant enough to prevent the conductive parts of multiple particles from forming continuous electrical connections, 3) a bulky attachment on the surface of a particle, where the bulky attachment can spatially prevent the conduce particle from electrically connecting with other particles to form a continuous electrical path. The coating layer can be an organic coating derived from small molecules, such as silanes; polymeric materials, or polymerizable small molecules, such as monomers, or a combination of these three types of materials. It can be inorganic coating, such as inorganic salt, vapor deposited metal oxide material, chemically formed nonconductive metal oxide using oxidizing agents, such as permanganate, chromate, osmium tetroxide, perchlorate, peroxides. One example of inorganic salt is the phosphate disclosed in U.S. Pat. No. 6,924,971 and U.S. Pat. No. 7,220,481.

Coated particles: particles whose surface is covered with a different material which provide insulation properties, and/or improve bonding to binder material, and/or improve the mixing properties of the particle with the binder material. The coating layer can be an organic coating derived from small molecules, such as silanes; polymeric materials, or polymerizable small molecules, such as monomers, or a combination of these three types of materials. It can be inorganic coating, such as inorganic salt, vapor deposited metal oxide material, chemically formed nonconductive metal oxide using oxidizing agents, such as permanganate, chromate, osmium tetroxide, perchlorate, peroxides.

Self-passivated metal: Some metals, such as aluminium, naturally form an oxide layer, such as alumina, on its surface in ambient condition. The oxide protects it from further oxidation. The oxide layer also can provide electric insulation properties.

DETAILED DESCRIPTION

DETAILED DESCRIPTION

In the present invention, multilayer devices comprising one or more insulation layers are used to avoid the electric shorting risks associated with conductive components in the high k polymer composite layer.

Figure 1:
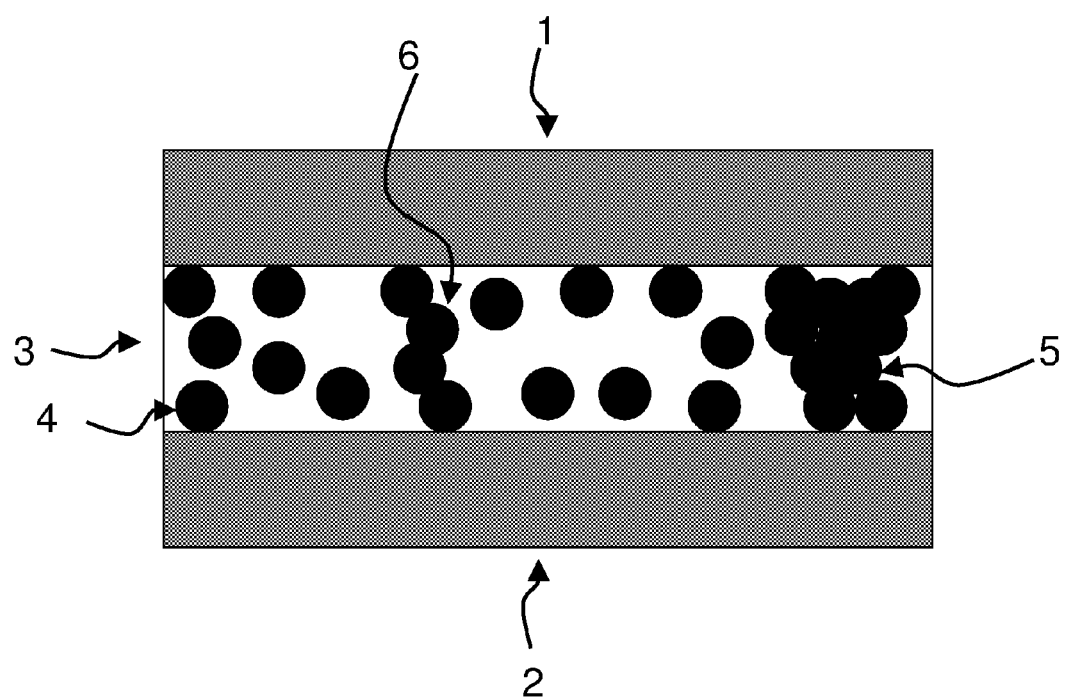
FIG. 1 is a cross-sectional illustration of the risk of electrical shorting when conductive components are included in embedded thin film capacitors.

FIG. 1 illustrates the electric shorting risks associated with thin composite material using conductive particles. Sandwiched between conductive layer 1 and 2 is layer 3, a high dielectric constant polymer composite material that contains conductive components 4. Conductive particles can connect with other particles and form conductive path, illustrated as 6, across the thickness of the layer. Conductive particles aggregate 5 can create electric shorting, too. Furthermore, smaller aggregates can connect with other aggregates or other conductive particles to create electric shorting across the thickness of the film.

Figures 2, 2A, 2B:
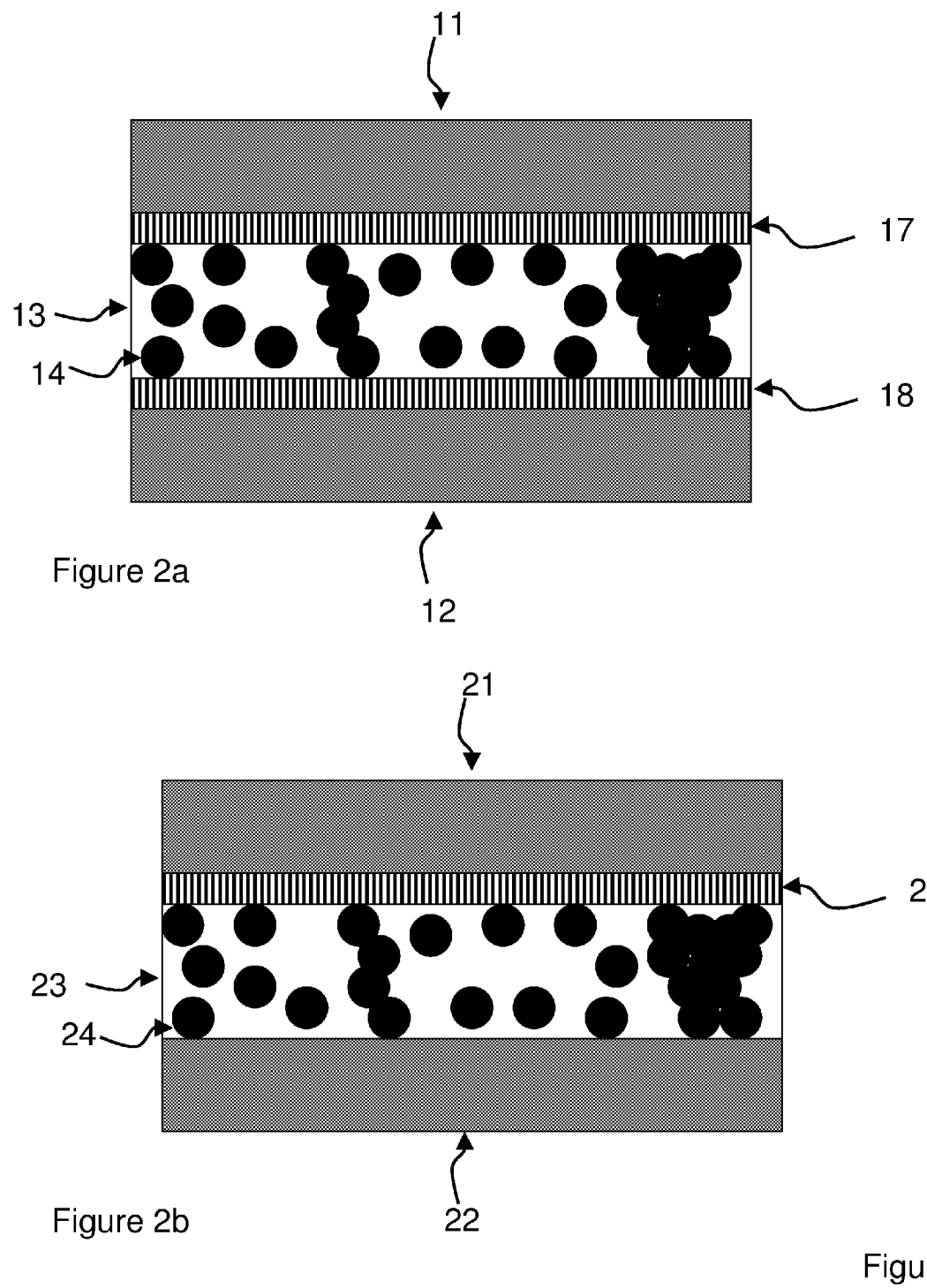
FIG. 2 is a cross-sectional illustration of employing one or two insulation layers sandwiched between the high dielectric constant polymer layer that contains conductive components and the conductive layer to prevent shorting across the thickness of dielectric structures.

To reduce or eliminate the short risks caused by the conductive components in the dielectric polymer layer, one embodiment of the present invention is to add one or two insulating layers to create a multilayer structure. FIG. 2 illustrates two embodiments of the current invention to eliminate these shorting risks associated with conductive components.

FIG. 2a illustrates a five layer structure that includes a high dielectric constant polymer composite layer, 13, that contains conductive components, 14, and two insulation layers, 17 and 18. Layer 13 is the high dielectric constant polymer layer that contains conductive component 14. Insulation layer 17 sits between conductive layer 11 and the high dielectric constant polymer layer 13; insulation layer 18 sits between conductive layer 12 and high dielectric constant polymer layer 13. These two insulation layer, 17 and 18, can reduce or eliminate the shorting risk caused by the electrically connected particle and/or aggregates of particles.

FIG. 2b illustrated a four-layer structure that includes one insulation layer, 27, and a high dielectric constant polymer layer, 23, which contains conductive components, 24.

The conductive components can be one conductive material or a combination of conductive materials which can be selected from carbon black, single wall or multi wall carbon nano-tube, fullerenes, metal particles, conductive oxides, conductive polymer particles. It can also be conductive polymer that is soluble in the binder polymer matrix. To fine tune performances and process properties, non-conductive fillers such as ceramic particles can also be added. Particle size is usually a distribution. D50 represent the median or the 50th percentile of the particle size distribution, as measured by volume. That is, the D50 is a value of the distribution such that 50% (by volume) of the particles have a volume of this value or less. To render the thin thickness of the dielectric layer ideal for high capacitance application, the particle sizes need to be small. Usually, the D50 need to be smaller than 20 micron, preferably to be smaller than 5 micron, more preferred to be smaller than 1 micron, and even more preferred to be smaller than 0.5 micron. For fiber-reinforced free-standing films, which usually have higher thickness, D50 can be as high as 40 microns. The particle sizes can be uniform or cover a broad range. It can also be a mixture of different sizes. The particles can be spherical shape, cylindrical shape, plate shape, or any other shapes.

The organic binder resin is one or a combination of organic materials that can solidify or crosslink into a strong solid structure which holds a variety of other components other than the said organic material together to form a stable solid mixture. It can be selected from epoxies, cyanate ester, polyester, polytetrafluoroethylene, PVDF, polyphenylene ether, and other polymers that are thermally stable under PCB process conditions.

In the binder formulation, there can be a variety of other additives. For example, curing agents and curing accelerators can cure the binder, dispersion agents can help the dispersion of fillers, defoamer can reduce the foam in process, rheology control agents can tailor the viscosity for process needs, resin modifiers, such as plasticizers or crosslinkers, can make the cured resin stronger or more flexible, thermal stabilizer can make the resin stable at high temperature, adhesion promoter can increase the bonding between polymer film and the conductive layer.

Figure 3:
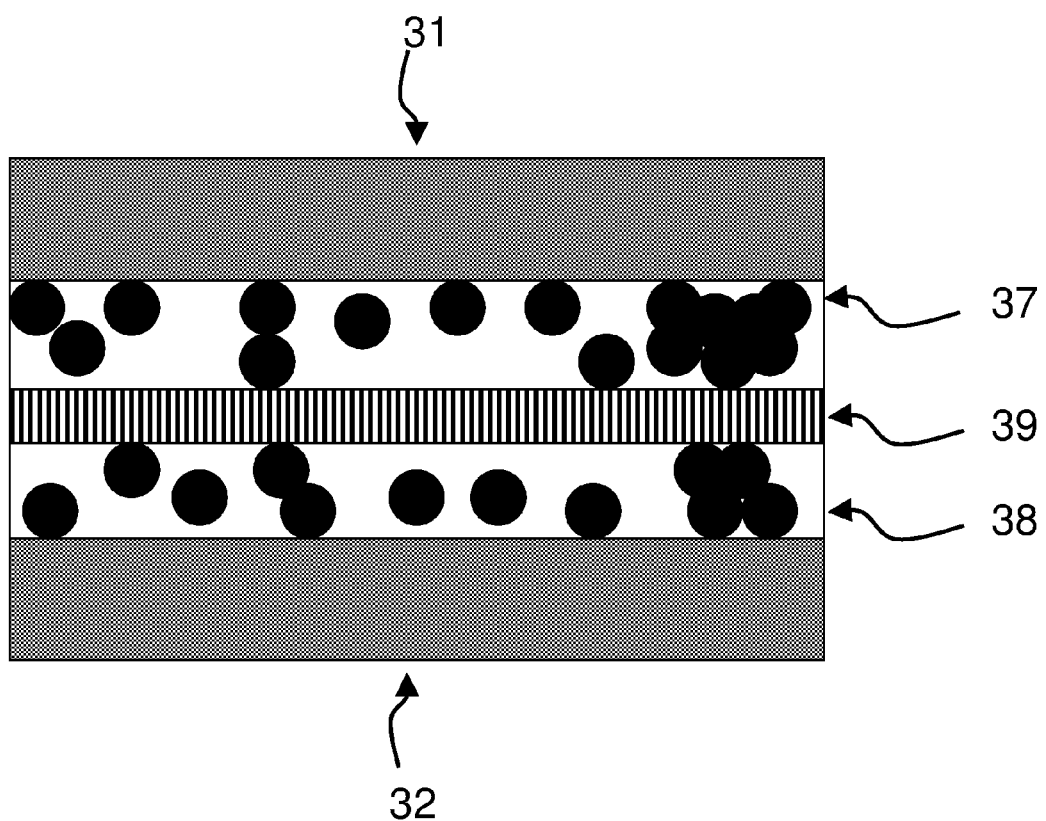
FIG. 3 is a cross-sectional illustration of another embodiment of this invention. One insulation layer is embedded in the high dielectric constant layer that contains conductive components to prevent shorting across the thickness of dielectric structure.

FIG. 3 illustrate another embodiment of the current invention that includes an insulation layer inside the high dielectric constant polymer layers that contains conductive particles. Alternatively, we can say that this shows an insulation layer sits between two high dielectric constant polymer layers that contain conductive particles.

The two insulation layers illustrated in FIGS. 2 and 3 can have the same or different compositions and thicknesses. Because the dielectric constant of the insulation layer directly affects the effective dielectric constant of the multilayer structure, it is desirable to put high dielectric components in the insulation layer to increase the dielectric constant. Examples are non-conductive ceramic powders such as barium titanate, non conductive or semi-conductive ceramic powders that has conductive domains, coated conductive powders, self-passivated metal powder, such as aluminum, aluminum alloy, magnesium, magnesium alloy, zinc, zinc alloy, titanium, and titanium alloy. It can even include conductive components, as long as the probability of the conductive paths in this layer connecting to the conductive paths in the next layer is reduced to insignificant level.

To achieve high dielectric constant, the insulation layer needs to be thin. To have good break-down voltage, it needs to be thick. Balancing the two needs for different applications, the insulation layer needs to be 0.001-10 micron, preferred to be 0.01-4 micron, more preferred to be 0.1-1 micron.

The insulation layer can be polymer based material or inorganic material. For example, vapor coated oxide layer or chemically formed oxide layer, such as oxygen or other oxidizing agent oxidized metal, can serve as insulation material. When the insulation layer is polymer composite with fillers, the particle size of the fillers need to be small to facilitate the thin coating. Usually, the filler particles need to be between 0.002 micron and 5 micron in diameters, preferably the D50 is between 0.1 micron and 2 micron, more preferred to be between 0.3 micron to 1 micron, and most preferred to be between 0.5-0.8 micron. The particles can be spherical shape, cylindrical shape, plate shape, or any other shapes.

The conductive layers are usually copper foil. Other conductive materials, selected from a list comprising aluminum, nickel, silver, conductive polymer, conductive polymer composite, conductive paste, can also be used. The surface of copper foil can be treated with other metal elements, metal oxides, silanes, and organic adhesion promoting agents to improve adhesion to organic substrate or to increase capacitance of the structure. Common surface treatment metal comprises nickel, chrome, titanium, tungsten, tin, phosphorus, sulfur, their oxides, and a combination therof. The metal foil surface can be mechanically or electro-chemically polished or be etched to modify surface roughness.

To make the devices illustrated in FIG. 2, an insulation layer is first coated on the copper foil. Solvent, if there is any, is then evaporated by heating the coated film in oven. The coated material can be cured, if one chooses to, to obtain coated copper foil that has layer 17 or 18. Then, one can coat the solution of the polymer composite that contains conductive components on the said coated copper foil to obtain a three layer structure A, which has three layers: 11, 17, and 13. The next step is to heat laminate film A with coated copper foil that has layer 12 and 18. Finally, curing the polymer resins completes the process.

The material of layer 17 and 18 may not have to be curable polymer material. For example, vapor coating of an oxide layer will not need curing. If it needs to be cured, depending on the nature of the material, it can be cured right after being coated on copper, or it can be cured after lamination.

Structure shown in FIG. 2b can be obtained with similar process. With only one insulation layers, there could be several variations. For example, layer 23 can be coated on layer 27 of the 27/21 two layer film. Then the three layer film: 21, 27, 23, can be laminated with copper foil 22. We can also coat 23 on 22 and laminate 23/22 with 27/21.

For structure illustrated in FIG. 3, the process is to coat layer 37 with 31 and 38 with 32 first, then cure layer 37, then coat layer 39 on 37. The next step is to laminate three layer film of 31, 37, and 39 with two layer film 38 and 32. Curing the final structure completes the process.

To strength the multilayer structure and to adjust coefficient of thermal expansion (CTE), solid films can be used as insulation layer as layer 39, 27, 18, and 17. The film can be selected from a list comprising polyimide film, liquid crystal polymer (LCP) film, teflon film, or PEEK film. Expanded plastic films include expanded Teflon. Another option is to add fibrous material in one or multiple layers, prefer only one layer. The fibrous material can be selected from a list comprising: aramid fiber, non-woven or woven aramid fiber cloth, glass fiber, non-woven or woven glass cloth, Nomax™ fiber, woven or non-woven Nomax™ cloth. These reinforcement materials can be used to make free standing dielectric laminate, which will be laminated with copper foils in panel form. They can also be applied directly into a polymer layer of the multilayer structure.

With these strengthening materials, the high dielectric constant film can be made as a thick free standing laminate film. In that case, the dielectric laminate film that contains conductive components can be coated with insulation layer and then laminated with copper foil. Or, alternatively, the laminate film that contains conductive component for high dielectric constant can be directly laminated with insulation layer coated copper foil.

The copper/multilayer dielectric material/copper device can go through typical micro-electronics processes to generate patterned conductive traces on dielectric materials, comprising, Via processes, plating, photo imaging, lamination. Details of those processes can be found in Print Circuit Board Handbook, Sixth edition, Edited by Clyde F. Coombs. The high capacitance of multilayered dielectric material will be used as embedded capacitor in the micro-electronic devices.

To further reduce the shorting risk, but still taking advantage of the high dielectric constant introduced by conductive domains, these multilayer structures can also incorporate coated conductive particles or particles with conductive domains to increase dielectric constant. Ceramic particles with conductive domains can be selected from a list comprising: a metal oxide of Zn, Ti, Zr, Hf, Ta, Ni, or Nb doped with one or a combination of elements selected from the group consisting of Cu, In, Sn, Sb, Hg, Tl, Pb, Bi, Cr, Co, Y, La, Ce, Er, Dy, Nd, Ca, Sr, Ba, Mn, Al, Ga, and other elements in rare earth group. In this type of high-K materials, the effective dielectric constant is achieved with the conductivity of domains that are electrically isolated one from another. The size of the conductive domain is typically from a few microns down to the nanometer scale.

It should be emphasized that the afore-mentioned embodiments of the present invention are merely possible examples of implementations, and are merely set forth for a clear understanding of the principles of the invention. Many variations and modifications may be made to the above-described embodiments of the invention without departing substantially from the spirit and principles of the invention. All such modifications and variations are intended to be included herein within the scope of the disclosure and the present invention and protected by the following claims.

What is claimed is:

1. A multilayer electronic device as embedded capacitor in integrated circuits comprising:
   two conductive layers, and
   at least one polymer composite layer that comprises a binder resin and a conductive component and at least one insulation layer that is bonded to the surface of the polymer composite layer, wherein the effective dielectric constant of the combined dielectric multilayer structure is higher than 13, and said conductive component has a particle size D50 smaller than 40 microns, and the thickness of the said insulation layer is not more than half of the combined thickness of said insulation layer and said polymer composite layer.

2. The multilayer device of claim 1, wherein the conductive component is selected from the group consisting of coated and uncoated conductive particles, coated and uncoated self-passivated metal particles, coated and uncoated ceramic particles that has conductive domains or conductive grain boundaries, coated and uncoated conductive magnetic particles, and a combination thereof.

3. The multilayer device of claim 1, wherein at least one insulation layer has a first surface bonded to the surface of the said polymer composite layer and a second surface bond to the surface of a conductive layer.

4. The multilayer device of claim 1, wherein the insulation layer comprises substantially a polymeric material.

5. The multilayer device of claim 4, wherein the said polymeric material is epoxy.

6. The multilayer device of claim 4, wherein the insulation layer further contains filler selected from the group consisting of a conductive filler, a coated conductive filler, a ceramic filler with conductive domains, a ceramic filler, and a combination thereof.

7. The multilayer device of claim 6, wherein the filler in the insulation layer has a particle size D50 smaller than 2 micron.

8. The multilayer device of claim 1, wherein the conductive components in the said polymer composite layer has a particle size D50 smaller than 5 micron.

9. The multilayer device of claim 1, wherein the conductive components in the said polymer composite layer has a particle size D50 smaller than 1 micron.

10. The multilayer device of claim 1, wherein the combined thickness of said insulation layer and said polymer composite layer is less than 50 microns.

11. The multilayer device of claim 1, wherein the combined thickness of said insulation layer and said polymer composite layer is less than 20 microns.

12. The multilayer device of claim 1, wherein the binder resin comprises epoxy.

13. The multiplayer device of claim 1, wherein the conductive layer is selected from the group consisting of copper foil, copper alloy foil, surface treated copper foil, and surface treated copper alloy foil.

14. The multilayer device of claim 1, wherein the conductive component comprises one or a combination of conductive materials selected from the group consisting of carbon black, single-wall or multi-wall carbon nano-tube, graphite, fullerenes, metal particles, conductive metal oxides, conductive polymer particles, and dispersible organic conductive materials.

15. The multilayer device of claim 1, wherein the conductive component comprises one or a combination of bare or coated conductive magnetic materials selected from the group consisting of: Ni, Ni alloys, Fe, Fe alloys, Co, Co alloys, and ferrites.

16. The multilayer device of claim 1, wherein the conductive component comprises ceramic particles with conductive domains selected from the group consisting of: a metal oxide of Zn, Ti, Zr, Hf, Ta, Ni, or Nb doped with one or a combination of elements selected from the group consisting of Cu, In, Sn, Sb, Hg, Tl, Pb, Bi, Cr, Co, Y, La, Ce, Er, Dy, Nd, Ca, Sr, Ba, Mn, Al, Ga, and other elements in rare earth group.

17. The multilayer device of claim 1, wherein the conductive component comprises self-passivated metal powder selected from the group consisting of aluminum, aluminum alloy, magnesium, magnesium alloy, zinc, zinc alloy, titanium, and titanium alloy.

18. The multilayer device of claim 1, wherein the polymer composite layer further comprises a fiber material selected from the group consisting of polyamide fiber, non-woven or woven polyamide fiber cloth, glass fiber, non-woven or woven glass fiber, liquid crystal polymer fiber, woven or non-woven liquid crystal polymer fiber, and other fiber that has melting temperature above 200° C.

19. The multilayer device of claim 1, wherein the polymer composite layer further comprises non-conductive or semi-conductive doped or undoped metal oxide fillers.

20. An electronic device that incorporates the multilayer device of claim 1.

* * * * *